US009025305B2

(12) United States Patent
Cooke et al.

(10) Patent No.: US 9,025,305 B2
(45) Date of Patent: May 5, 2015

(54) HIGH SURFACE RESISTIVITY ELECTROSTATIC CHUCK

(75) Inventors: Richard A. Cooke, Framingham, MA (US); Dale K. Stone, Lynnfield, MA (US); Lyudmila Stone, Lynnfield, MA (US); Julian Blake, Gloucester, MA (US); David Suuronen, Newburyport, MA (US)

(73) Assignees: Entegris, Inc., Eillerica, MA (US); Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/699,279

(22) PCT Filed: May 24, 2011

(86) PCT No.: PCT/US2011/037712
§ 371 (c)(1),
(2), (4) Date: Nov. 20, 2012

(87) PCT Pub. No.: WO2011/149918
PCT Pub. Date: Dec. 1, 2011

(65) Prior Publication Data
US 2013/0070384 A1 Mar. 21, 2013

Related U.S. Application Data

(60) Provisional application No. 61/349,504, filed on May 28, 2010.

(51) Int. Cl.
*H01T 23/00* (2006.01)
*H02N 13/00* (2006.01)
(Continued)

(52) U.S. Cl.
CPC ............... *H02N 13/00* (2013.01); *B23Q 3/152* (2013.01); *C04B 37/005* (2013.01);
(Continued)

(58) Field of Classification Search
USPC .................................................. 361/230–234
See application file for complete search history.

(56) References Cited

U.S. PATENT DOCUMENTS 4,184,188 A    1/1980  Briglia
5,179,498 A    1/1993  Hongoh et al.
(Continued)

FOREIGN PATENT DOCUMENTS

CN    101043018      9/2007
EP    1 119 040 A2   7/2001
(Continued)

OTHER PUBLICATIONS

Notification of Transmittal of the International Search Report and Written Opinion of the International Searching Authority from counterpart International Application No. PCT/US2011/037712, "High Surface Resistivity Electrostatic Chuck", dated Jan. 10, 2012.
(Continued)

*Primary Examiner* — Danny Nguyen
(74) *Attorney, Agent, or Firm* — Hamilton Brook Smith & Reynolds, PC

(57) ABSTRACT

In accordance with an embodiment of the invention, there is provided an electrostatic chuck. The electrostatic chuck comprises an electrode, and a surface layer activated by a voltage in the electrode to form an electric charge to electrostatically clamp a substrate to the electrostatic chuck, the surface layer including a charge control layer comprising a surface resistivity of greater than about $10^{11}$ ohms per square.

14 Claims, 3 Drawing Sheets

(51) Int. Cl.
  *B23Q 3/152*   (2006.01)
  *C04B 37/00*   (2006.01)
  *H01L 21/683*  (2006.01)
  *B05D 5/12*    (2006.01)
  *C23F 1/00*    (2006.01)

(52) U.S. Cl.
  CPC .......... *C04B 37/008* (2013.01); *C04B 2237/06* (2013.01); *C04B 2237/062* (2013.01); *C04B 2237/08* (2013.01); *C04B 2237/083* (2013.01); *C04B 2237/086* (2013.01); *C04B 2237/341* (2013.01); *C04B 2237/343* (2013.01); *C04B 2237/365* (2013.01); *C04B 2237/368* (2013.01); *H01L 21/6833* (2013.01); *B05D 5/12* (2013.01); *C23F 1/00* (2013.01)

(56) References Cited

U.S. PATENT DOCUMENTS

| | | |
|---|---|---|
| 5,250,137 A | 10/1993 | Arami et al. |
| 5,310,453 A | 5/1994 | Fukasawa et al. |
| 5,350,479 A | 9/1994 | Collins et al. |
| 5,382,311 A | 1/1995 | Ishikawa et al. |
| 5,413,360 A | 5/1995 | Atari et al. |
| 5,539,609 A | 7/1996 | Collins et al. |
| 5,557,215 A | 9/1996 | Saeki et al. |
| 5,583,736 A | 12/1996 | Anderson et al. |
| 5,583,737 A | 12/1996 | Collins et al. |
| 5,591,269 A | 1/1997 | Arami et al. |
| 5,625,526 A | 4/1997 | Watanabe et al. |
| 5,656,093 A | 8/1997 | Burkhart et al. |
| 5,691,876 A | 11/1997 | Chen et al. |
| 5,701,228 A | 12/1997 | Ishii |
| 5,740,009 A | 4/1998 | Pu et al. |
| 5,748,434 A | 5/1998 | Rossman et al. |
| 5,761,023 A | 6/1998 | Lue et al. |
| 5,764,471 A | 6/1998 | Burkhart |
| 5,777,838 A | 7/1998 | Tamagawa et al. |
| 5,779,803 A | 7/1998 | Kurono et al. |
| 5,792,562 A | 8/1998 | Collins et al. |
| 5,800,871 A | 9/1998 | Collins et al. |
| 5,825,607 A | 10/1998 | Burkhart |
| 5,851,298 A | 12/1998 | Ishii |
| 5,868,848 A | 2/1999 | Tsukamoto |
| 5,870,271 A | 2/1999 | Herchen |
| 5,880,924 A | 3/1999 | Kumar et al. |
| 5,886,865 A | 3/1999 | Parkhe et al. |
| 5,886,866 A | 3/1999 | Hausmann |
| 5,903,428 A | 5/1999 | Grimard et al. |
| 5,908,334 A | 6/1999 | Chen et al. |
| 5,914,568 A | 6/1999 | Nonaka |
| 5,916,689 A | 6/1999 | Collins et al. |
| 5,923,521 A | 7/1999 | Burkhart |
| 5,946,183 A | 8/1999 | Yamada et al. |
| 5,946,184 A | 8/1999 | Kanno et al. |
| 5,997,962 A | 12/1999 | Ogasawara et al. |
| 6,028,762 A | 2/2000 | Kamitani |
| 6,051,122 A | 4/2000 | Flanigan |
| 6,055,150 A | 4/2000 | Clinton et al. |
| 6,072,685 A | 6/2000 | Herchen |
| 6,081,414 A | 6/2000 | Flanigan et al. |
| 6,088,213 A | 7/2000 | Herchen |
| 6,104,595 A | 8/2000 | Brown |
| 6,104,596 A | 8/2000 | Hausmann |
| 6,108,189 A | 8/2000 | Weldon et al. |
| 6,117,246 A | 9/2000 | Parkhe et al. |
| 6,125,025 A | 9/2000 | Howald et al. |
| 6,134,096 A | 10/2000 | Yamada et al. |
| 6,175,485 B1 | 1/2001 | Krishnaraj et al. |
| 6,198,616 B1 | 3/2001 | Dahimene et al. |
| 6,215,640 B1 | 4/2001 | Hausmann |
| 6,217,655 B1 | 4/2001 | Kumar et al. |
| 6,243,251 B1 | 6/2001 | Kanno et al. |
| RE37,294 E | 7/2001 | Knapp et al. |
| 6,259,592 B1 | 7/2001 | Ono |
| 6,304,424 B1 | 10/2001 | Mett et al. |
| 6,338,861 B1 | 1/2002 | Gozu et al. |
| 6,370,004 B1 | 4/2002 | Yamaguchi |
| 6,373,681 B2 | 4/2002 | Kanno et al. |
| 6,414,834 B1 | 7/2002 | Weldon et al. |
| 6,433,346 B1 | 8/2002 | Hirayanagi |
| 6,441,939 B1 | 8/2002 | Bigo et al. |
| 6,452,775 B1 | 9/2002 | Nakajima |
| 6,475,336 B1 | 11/2002 | Hubacek |
| 6,483,690 B1 | 11/2002 | Nakajima et al. |
| 6,490,145 B1 | 12/2002 | Kholodenko et al. |
| 6,522,519 B1 | 2/2003 | Hirayanagi |
| 6,567,257 B2 | 5/2003 | Brown |
| 6,608,745 B2 | 8/2003 | Tsuruta et al. |
| 6,625,003 B2 | 9/2003 | Loo et al. |
| 6,628,503 B2 | 9/2003 | Sogard |
| 6,634,177 B2 | 10/2003 | Lin et al. |
| 6,641,939 B1 | 11/2003 | Lee et al. |
| 6,646,233 B2 | 11/2003 | Kanno et al. |
| 6,678,143 B2 | 1/2004 | Masuda et al. |
| 6,687,113 B2 | 2/2004 | Saito et al. |
| 6,721,162 B2 | 4/2004 | Weldon et al. |
| 6,723,274 B1 | 4/2004 | Divakar |
| 6,754,062 B2 | 6/2004 | Logan et al. |
| 6,785,115 B2 | 8/2004 | Tsuruta et al. |
| 6,790,375 B1 | 9/2004 | Howald et al. |
| 6,813,134 B2 | 11/2004 | Tatsumi et al. |
| 6,835,415 B2 | 12/2004 | Blaedel et al. |
| 6,839,217 B1 | 1/2005 | Larsen |
| 6,853,953 B2 | 2/2005 | Brcka et al. |
| 6,950,297 B2 | 9/2005 | Kosakai |
| 6,982,125 B2 | 1/2006 | LaCourse et al. |
| 7,042,697 B2 | 5/2006 | Tsuruta et al. |
| 7,052,553 B1 | 5/2006 | Shih et al. |
| 7,075,771 B2 | 7/2006 | Brcka |
| 7,078,655 B1 | 7/2006 | Ito et al. |
| 7,088,431 B2 | 8/2006 | Ottens et al. |
| 7,142,405 B2 | 11/2006 | Miyaji et al. |
| 7,175,737 B2 | 2/2007 | Sago et al. |
| 7,187,433 B2 | 3/2007 | Ottens et al. |
| 7,196,896 B2 | 3/2007 | Howald et al. |
| 7,198,276 B2 | 4/2007 | Caldwell et al. |
| 7,209,339 B2* | 4/2007 | Kitabayashi et al. ......... 361/234 |
| 7,220,319 B2 | 5/2007 | Sago et al. |
| 7,307,697 B2 | 12/2007 | GanapathiSubramanian et al. |
| 7,330,346 B2 | 2/2008 | Ikuhara et al. |
| 7,335,315 B2 | 2/2008 | Matsuda et al. |
| 7,824,498 B2 | 11/2010 | Parkhe et al. |
| 8,861,170 B2 | 10/2014 | Lin et al. |
| 8,879,233 B2 | 11/2014 | Cooke et al. |
| 2001/0003298 A1* | 6/2001 | Shamouilian et al. ........ 156/345 |
| 2001/0019472 A1 | 9/2001 | Kanno et al. |
| 2001/0055190 A1 | 12/2001 | Saito et al. |
| 2002/0000521 A1 | 1/2002 | Brown |
| 2002/0008954 A1 | 1/2002 | Leeser |
| 2002/0012219 A1 | 1/2002 | Tsuruta et al. |
| 2002/0021545 A1 | 2/2002 | Tatsumi et al. |
| 2002/0027762 A1 | 3/2002 | Yamaguchi |
| 2002/0036373 A1 | 3/2002 | Kosakai |
| 2002/0109955 A1 | 8/2002 | Masuda et al. |
| 2002/0130276 A1 | 9/2002 | Sogard |
| 2002/0135969 A1 | 9/2002 | Weldon et al. |
| 2002/0144657 A1 | 10/2002 | Chiang et al. |
| 2002/0144786 A1 | 10/2002 | Chiang et al. |
| 2002/0146511 A1 | 10/2002 | Chiang et al. |
| 2002/0158270 A1* | 10/2002 | Yamamoto et al. .......... 257/200 |
| 2002/0159217 A1 | 10/2002 | Tsuruta et al. |
| 2002/0167779 A1 | 11/2002 | Carroll et al. |
| 2002/0170882 A1 | 11/2002 | Akiba |
| 2003/0010292 A1 | 1/2003 | Kholodenko et al. |
| 2003/0053283 A1 | 3/2003 | Loo et al. |
| 2003/0095370 A1 | 5/2003 | Tsuruta et al. |
| 2003/0123213 A1 | 7/2003 | Kosakai |
| 2003/0165043 A1 | 9/2003 | Logan et al. |
| 2003/0168439 A1 | 9/2003 | Kanno et al. |
| 2004/0040665 A1 | 3/2004 | Mizuno et al. |
| 2004/0055709 A1 | 3/2004 | Boyd, Jr. et al. |
| 2004/0070916 A1 | 4/2004 | Tsuruta et al. |

(56) References Cited

U.S. PATENT DOCUMENTS

| | | |
|---|---|---|
| 2004/0121192 A1 | 6/2004 | LaCourse et al. |
| 2004/0124595 A1 | 7/2004 | Miyaji et al. |
| 2004/0131775 A1 | 7/2004 | Blaedel et al. |
| 2004/0160021 A1 | 8/2004 | Tatsumi et al. |
| 2004/0173469 A1 | 9/2004 | Udo et al. |
| 2004/0190215 A1 | 9/2004 | Weldon et al. |
| 2004/0233608 A1 | 11/2004 | Brcka |
| 2004/0233609 A1 | 11/2004 | Yoshida et al. |
| 2005/0018377 A1 | 1/2005 | Cho et al. |
| 2005/0029244 A1 | 2/2005 | Ito et al. |
| 2005/0036268 A1 | 2/2005 | Howald et al. |
| 2005/0045106 A1 | 3/2005 | Boyd, Jr. et al. |
| 2005/0069726 A1 | 3/2005 | Douglas et al. |
| 2005/0079737 A1 | 4/2005 | Kellermam et al. |
| 2005/0087939 A1 | 4/2005 | Caldwell et al. |
| 2005/0095410 A1 | 5/2005 | Mazurkiewicz |
| 2005/0106320 A1 | 5/2005 | Mehregany et al. |
| 2005/0247672 A1* | 11/2005 | Tatsumi ............... 216/67 |
| 2005/0263077 A1 | 12/2005 | GanapathiSubramanian et al. |
| 2005/0264134 A1 | 12/2005 | GanapathiSubramanian et al. |
| 2006/0108231 A1 | 5/2006 | Weichart |
| 2006/0112969 A1 | 6/2006 | Shih et al. |
| 2006/0121195 A1 | 6/2006 | Udo et al. |
| 2006/0158823 A1 | 7/2006 | Mizuno et al. |
| 2007/0047170 A1 | 3/2007 | Sun et al. |
| 2007/0109714 A1 | 5/2007 | Chung |
| 2007/0128570 A1 | 6/2007 | Goto et al. |
| 2007/0146961 A1* | 6/2007 | Morioka et al. ............ 361/234 |
| 2007/0195482 A1 | 8/2007 | Muka et al. |
| 2007/0217114 A1 | 9/2007 | Sasaki et al. |
| 2007/0217118 A1 | 9/2007 | Ikuhara et al. |
| 2007/0222131 A1 | 9/2007 | Fukumoto et al. |
| 2007/0223173 A1 | 9/2007 | Fujisawa et al. |
| 2007/0253139 A1 | 11/2007 | Nakano et al. |
| 2007/0258184 A1 | 11/2007 | Lee |
| 2007/0258186 A1 | 11/2007 | Matyushkin et al. |
| 2007/0283891 A1 | 12/2007 | Okayama |
| 2008/0017104 A1 | 1/2008 | Matyushkin et al. |
| 2008/0037195 A1 | 2/2008 | Himori et al. |
| 2008/0037196 A1 | 2/2008 | Yonekura et al. |
| 2008/0041312 A1 | 2/2008 | Matsuyama et al. |
| 2008/0062609 A1 | 3/2008 | Himori et al. |
| 2008/0062610 A1 | 3/2008 | Himori et al. |
| 2008/0062611 A1 | 3/2008 | Himori et al. |
| 2008/0062612 A1 | 3/2008 | Morioka et al. |
| 2008/0066676 A1* | 3/2008 | Mariner et al. ............ 118/715 |
| 2008/0073032 A1 | 3/2008 | Koshiishi et al. |
| 2008/0083700 A1 | 4/2008 | Bernard et al. |
| 2008/0100983 A1 | 5/2008 | Purohit et al. |
| 2008/0106842 A1 | 5/2008 | Ito et al. |
| 2008/0144251 A1 | 6/2008 | Tao et al. |
| 2008/0239614 A1 | 10/2008 | Blake et al. |
| 2009/0242544 A1* | 10/2009 | Kano ............... 219/444.1 |
| 2009/0284894 A1 | 11/2009 | Cooke |
| 2012/0044609 A1 | 2/2012 | Cooke et al. |
| 2013/0120897 A1 | 5/2013 | Lin et al. |

FOREIGN PATENT DOCUMENTS

| | | |
|---|---|---|
| EP | 1 801 961 A2 | 6/2007 |
| JP | 02-027748 A | 1/1990 |
| JP | 02-304946 A | 12/1990 |
| JP | 5243367 A | 9/1993 |
| JP | 11-214494 A | 8/1999 |
| JP | 2000100917 | 4/2000 |
| JP | 2002-141404 A | 5/2002 |
| JP | 2002-299425 A | 10/2002 |
| JP | 2003-060020 | 2/2003 |
| JP | 2003-282688 A | 10/2003 |
| JP | 200422889 | 1/2004 |
| JP | 200533125 A | 2/2005 |
| JP | 2007158286 A | 6/2007 |
| JP | 2007-194320 A | 8/2007 |
| KR | 10-2005-0064912 A | 6/2005 |
| KR | 10-2006-0081562 A | 7/2006 |
| KR | 100717694 B1 | 5/2007 |
| KR | 10-2007-0066890 A | 6/2007 |
| KR | 10-0755874 B1 | 9/2007 |
| WO | WO 99/16122 | 4/1999 |
| WO | WO 99/25006 | 5/1999 |
| WO | WO 99/29001 | 6/1999 |
| WO | WO 99/52144 | 10/1999 |
| WO | WO 99/54928 | 10/1999 |
| WO | WO 99/57753 | 11/1999 |
| WO | WO 99/60613 | 11/1999 |
| WO | WO 99/62115 | 12/1999 |
| WO | WO 00/19519 | 4/2000 |
| WO | WO 00/19592 | 4/2000 |
| WO | WO 00/35003 | 6/2000 |
| WO | WO 01/42163 A2 | 6/2001 |
| WO | WO 02/31219 A1 | 4/2002 |
| WO | WO 03/003449 A2 | 1/2003 |
| WO | WO 03/008666 A1 | 1/2003 |
| WO | WO 2004/027839 A2 | 4/2004 |
| WO | WO 2004/059701 A2 | 7/2004 |
| WO | WO 2004/059714 A1 | 7/2004 |
| WO | WO 2004/107387 A2 | 12/2004 |
| WO | WO 2005/119802 A2 | 12/2005 |
| WO | WO 2006/060234 A2 | 6/2006 |
| WO | WO 2007/043519 A1 | 4/2007 |
| WO | WO 2007/064435 A2 | 6/2007 |
| WO | WO 2007/100571 A2 | 9/2007 |
| WO | WO 2008/088471 A1 | 7/2008 |
| WO | WO 2008/118683 A1 | 10/2008 |
| WO | WO 2009/013803 A1 | 1/2009 |
| WO | WO 99/48148 | 9/2009 |
| WO | WO 2009/142710 A1 | 11/2009 |
| WO | WO 2010/132640 A2 | 11/2010 |
| WO | WO 2011/149918 A2 | 12/2011 |
| WO | WO 2012/033922 | 3/2012 |

OTHER PUBLICATIONS

Notification of Transmittal of International Preliminary Report on Patentability, PCT/US2011/037712, "High Surface Resistivity Electrostatic Chuck" dated Sep. 18, 2012.

International Search Report from counterpart International Application No. PCT/US2009/003015, "Electrostatic Chuck," Dated: Jul. 16, 2009.

Written Opinion of the International Searching Authority from counterpart Interantional Application No. PCT/US2009/003015, "Electrostatic Chuck," Dated: Jul. 16, 2009.

International Preliminary Report in Patentability from counterpart International Application No. PCT/US2009/003015, "Electrostatic Chuck," Dated: Dec. 2, 2010.

Supplementary European Search Report, EP10775520, "Electrostatic Chuck with Polymer Protrusions," Dated Oct. 18, 2013.

Notification of Transmittal of the International Search Report and Written Opinion of the International Searching Authority from the counterpart International Application No. PCT/US2010/034667, "Electrostatic Chunk with Polymer Protrusions," Dated: Feb. 1, 2011.

International Preliminary Report on Patentability for PCT/US2010/034667, "Electrostatic Chuck with Polymer Protrusions," Dated: Nov. 15, 2011 (4 pgs.).

Non-Final Office Action for U.S. Appl. No. 12/454,336, "Electrostatic Chunk"; Date Mailed: Jul. 10, 2012.

Non-Final Office Action for U.S. Appl. No. 12/454,336, "Electrostatic Chunk"; dated Dec. 20, 2012.

Non-Final Office Action for U.S. Appl. No. 12/454,336, "Electrostatic Chunk"; Date Mailed: Mar. 26, 2013.

Final Office Action for U.S. Appl. No. 12/454,336, "Electrostatic Chunk"; Date Mailed: Oct. 15, 2013.

Non-Final Office Action for U.S. Appl. No. 13/266,657, "Electrostatic Chunk with Polymer Protrusions"; Date Mailed: Nov. 8, 2013.

Non-Final Office Action for U.S. Appl. No. 12/454,336, "Electrostatic Chunk"; Date Mailed: Feb. 26, 2014.

Notification of Transmittal of the International Search Report and Written Opinion of the Internation Searching Authority from counterpart International Application No. PCT/US2013/067301 "Electro-

(56) References Cited

OTHER PUBLICATIONS static Chuck with Photo-Patternable Soft Protrusion Contact Surface", Date Mailed: Jan. 16, 2014.
Search Report for Taiwan Application No. 098115989 "Electrostatic Chuck"; Date of Completion: Feb. 17, 2014 (2 pp.).
Notice of Allowance for U.S. Appl. No. 13/266,657, "Electrostatic Chuck with Polymer Protrusions", Date Mailed: Apr. 10, 2014.
Notice of Allowance for U.S. Appl. No. 13/266,657, "Electrostatic Chuck with Polymer Protrusions", Date Mailed: Jul. 18, 2014.
Notice of Allowance for U.S. Appl. No. 13/667,516, "Electrostatic Chuck with Photo-Patternable Soft Protrusion Contact Surface", Date Mailed: Jun. 13, 2014.
Final Office Action for U.S. Appl. No. 12/454,336 entitled "Electrostatic Chuck", mailed Sep. 11, 2014.
Second Written Opinion of the International Preliminary Examining Authority for International Application No. PCT/US2013/067301 "Electrostatic Chuck with Photo-Patternable Soft Protrusion Contact Surface", mailed Oct. 16, 2014.

\* cited by examiner

HIGH SURFACE RESISTIVITY ELECTROSTATIC CHUCK

RELATED APPLICATION

This application is the U.S. National Stage of International Application No. PCT/US2011/037712, filed May 24, 2011, which designates the U.S., published in English, and claims the benefit of U.S. Provisional Application No. 61/349,504, filed May 28, 2010. The entire teachings of the above application are incorporated herein by reference.

STATEMENT REGARDING JOINT RESEARCH AGREEMENT

The claimed invention was made by, or on behalf of, one or more parties to a joint research agreement that was in effect on or before the date the claimed invention was made. The parties to the joint research agreement are Entegris, Inc. and Varian Semiconductor Equipment Associates, Inc., now a wholly owned subsidiary of Applied Materials, Inc.

BACKGROUND OF THE INVENTION

An electrostatic chuck holds and supports a substrate during a manufacturing process and also removes heat from the substrate without mechanically clamping the substrate. During use of an electrostatic chuck, the back side of a substrate, such as a semiconductor wafer, is held to the face of the electrostatic chuck by an electrostatic force. The substrate is separated from one or more electrodes in the face of the electrostatic chuck by a surface layer of material that covers the electrode. In a Coulombic chuck, the surface layer is electrically insulating, while in a Johnsen-Rahbek electrostatic chuck, the surface layer is weakly conducting. The surface layer of the electrostatic chuck may be flat or may have one or more protrusions, projections or other surface features that further separate the back side of the substrate from the covered electrode.

In the design of electrostatic chucks, there is an ongoing need to avoid the problem of "wafer sticking," which occurs when a wafer or other substrate electrostatically adheres to the chuck surface after the chuck power is removed.

SUMMARY OF THE INVENTION

In accordance with an embodiment of the invention, there is provided an electrostatic chuck. The electrostatic chuck comprises an electrode, and a surface layer activated by a voltage in the electrode to form an electric charge to electrostatically clamp a substrate to the electrostatic chuck, the surface layer including a charge control layer comprising a surface resistivity of greater than about $10^{11}$ ohms per square.

In further, related embodiments, the charge control layer can comprise a surface resistivity of greater than about $10^{12}$ ohms per square, or greater than about $10^{13}$ ohms per square, or from about $1\times10^{11}$ ohms/square to about $1\times10^{16}$ ohms/square, or from about $1\times10^{12}$ ohms/square to about $1\times10^{16}$ ohms/square, or from about $1\times10^{13}$ ohms/square to about $1\times10^{16}$ ohms/square. The charge control layer can comprise a polymer such as at least one of polyetherimide (PEI), polyimide and polyether ether ketone (PEEK). The charge control layer can comprise at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon; such as at least one of $SiO_xN_y$, silicon nitride, silicon oxide, silicon carbide, and diamond-like carbon. As used herein, "$SiO_xN_y$" may contain elemental hydrogen, and neglecting the hydrogen (which may, for example, be present up to about 20 atomic percent), the variable x can, for example, range from 0 to 2 and the variable y can, for example, range from 0 to 1.4, where it is intended by the values of zero for x and/or y that Oxygen and/or Nitrogen can be absent. Alternatively, in such a range, one or more of Oxygen and Nitrogen may be present in at least some non-zero amount.

In further embodiments, the surface layer can include a plurality of polymer protrusions extending to a height above portions of the charge control layer surrounding the plurality of polymer protrusions to support the substrate upon the plurality of polymer protrusions during electrostatic clamping of the substrate. The polymer of which the plurality of polymer protrusions are formed can comprise at least one of polyetherimide (PEI), polyimide and polyether ether ketone (PEEK). The plurality of polymer protrusions can be substantially equally spaced across the surface layer as measured by center to center distance between pairs of neighboring polymer protrusions; and can be arranged in a trigonal pattern.

In another embodiment according to the invention, there is provided a method of manufacturing an electrostatic chuck. The method comprises forming a charge control layer in the electrostatic chuck, the charge control layer comprising a surface resistivity of greater than about $10^{11}$ ohms per square.

In further, related embodiments, the charge control layer can comprise a surface resistivity of greater than about $10^{12}$ ohms per square, or greater than about $10^{13}$ ohms per square, or from about $1\times10^{11}$ ohms/square to about $1\times10^{16}$ ohms/square, or from about $1\times10^{12}$ ohms/square to about $1\times10^{16}$ ohms/square, or from about $1\times10^{13}$ ohms/square to about $1\times10^{16}$ ohms/square. The method can comprise reducing frequency of wafer sticking in use of the electrostatic chuck without modifying the functioning of the electrostatic chuck, such as without modifying at least one of the power supply, electrode structure, dielectric thickness, mechanical properties and clamping force of the electrostatic chuck. The method can comprise controlling a ratio of silicon to other substances in the charge control surface layer, by atomic percent, in order to achieve a desired level of surface resistivity. Forming the charge control layer can comprise altering the surface resistivity of a surface layer that has already been produced. The altering the surface resistivity can comprise treating the surface layer, which has already been produced, using a reactive ion etch process. The altering the surface resistivity can comprise performing at least one of a plasma treatment, a chemical treatment and a rehydrogenation treatment of the surface layer that has already been produced. The altering of the surface resistivity can produce a surface resistivity after treatment that is within plus or minus 25% of what the surface resistivity would have been prior to treatment. The method can comprise, prior to forming the charge control layer: bonding a dielectric layer of the electrostatic chuck to an insulator layer of the electrostatic chuck; coating the dielectric layer of the electrostatic chuck with an adhesion coating layer comprising at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon; bonding a charge control layer comprising a charge control layer polymer to the surface of the electrostatic chuck, the charge control layer polymer comprising at least one of polyetherimide (PEI), polyimide and polyether ether ketone (PEEK); depositing a photoresist onto the charge control layer; reactive ion etching the charge control layer to remove portions of the charge control layer that will surround a plurality of polymer protrusions being formed in the charge control layer; and stripping the photoresist off the electrostatic chuck, thereby revealing the plurality of polymer protrusions being formed of the same charge control layer polymer as the charge control layer.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

In accordance with an embodiment of the invention, there is provided an electrostatic chuck that includes a charge control surface layer having a high surface resistivity, for example greater than about $10^{11}$ ohms per square, including greater than about $10^{12}$ ohms per square and greater than about $10^{13}$ ohms per square. The inclusion of a charge control surface layer having such high surface resistivities has been found to prevent wafer sticking to the electrostatic chuck while not interfering with the electrostatic attraction between the electrostatic chuck and the substrate. In accordance with an embodiment of the invention, a high surface resistivity charge control surface layer may be produced by altering the surface resistivity of a surface layer that initially has a lower surface resistivity, for example by reactive ion etching, including plasma treatment, chemical treatment and/or rehydrogenation treatment.

Without wishing to be bound by theory, it is believed that the high surface resistivity of a charge control surface layer in accordance with an embodiment of the invention helps to counteract the impact of a triboelectric effect between the electrostatic chuck and the substrate. This may be a particular problem where substrates are coated with thick insulator coatings. Substrates coated with a thick insulator (such as an oxide or nitride) can tend to stick to the electrostatic clamping surface, which can result in wafer handling problems and even the need to scrap wafers. Such problems can occur with both electrostatic and mechanical clamping systems. In accordance with an embodiment of the invention, controlling the surface resistivity of the clamp surface to a high surface resistivity, such as greater than about $10^{11}$ ohms per square or other ranges discussed herein, is believed to minimize the impact of triboelectric charging of substrate and clamp during the dechucking of the insulator coated substrate. Such a high surface resistivity may be used for both electrostatic and mechanical clamping systems. In accordance with an embodiment of the invention, wafer sticking may be prevented without modifying the functioning of the clamp, such as without modifying the power supply, electrode structure, dielectric thickness, mechanical properties and/or clamping force, as is done in other techniques of preventing wafer sticking.

Figure 1:
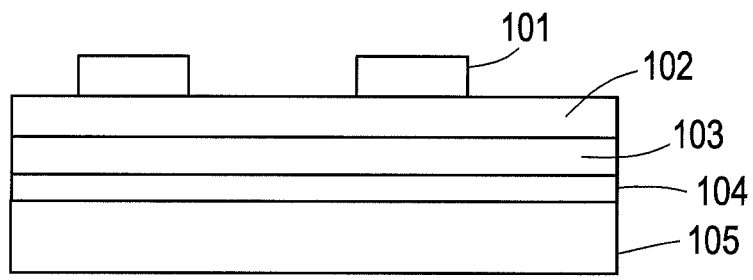
FIG. 1 is a cross-sectional diagram of the top layers of an electrostatic chuck in accordance with an embodiment of the invention.

FIG. 1 is a cross-sectional diagram of the top layers of an electrostatic chuck in accordance with an embodiment of the invention. The electrostatic chuck may feature protrusions 101 on its surface for mounting a substrate. The electrostatic chuck features a charge control surface layer 102, to which the protrusions 101 may adhere. The purpose of the charge control layer 102 is to provide a conductive layer to bleed away surface charge. The charge control layer 102 reduces the likelihood of wafer sticking. A charge control layer 102 having a surface resistivity in an appropriate range, such as, for example, greater than about $10^{11}$ ohms per square, including greater than about $10^{12}$ ohms per square, greater than about $10^{13}$ ohms per square, and/or a range of from about $1\times10^{11}$ ohms/square to about $1\times10^{16}$ ohms/square, and/or a range of from about $1\times10^{12}$ ohms/square to about $1\times10^{16}$ ohms/square, and/or a range of from about $1\times10^{13}$ ohms/square to about $1\times10^{16}$ ohms/square, reduces wafer sticking. The slightly conductive surface layer bleeds charge to ground (not shown) while not interfering with the electrostatic attraction between the electrostatic chuck and the substrate. An adhesive layer 103 may be underneath the charge control layer 102. Alternatively, the adhesive layer 103 need not be present. Underneath the adhesive layer 103 (or directly underneath the charge control layer 102), the electrostatic chuck may include an adhesion coating 104 that encourages the layers above it to adhere to the dielectric layer 105. The adhesion coating 104 may, for example, include silicon containing nitrides, oxides, carbides and non-stoichiometric versions of these, for example but not limited to $SiO_xN_y$, silicon nitride, silicon oxide or silicon carbide. The adhesion coating layer may also comprise carbon or a nitride compound of carbon; and may comprise diamond-like carbon; and/or a combination of any of the foregoing. Underneath the adhesion coating 104 is a dielectric layer 105, such as an alumina dielectric. As used herein, the term "surface layer" includes a charge control layer 102 and any protrusions 101 that are present in the electrostatic chuck.

In one embodiment according to the invention, the protrusions 101 may be formed of a polymer, such as polyetherimide (PEI), polyimide or polyether ether ketone (PEEK). The charge control surface layer 102 may be formed of the same polymer substance as the protrusions 101, such as polyetherimide (PEI), polyimide or polyether ether ketone (PEEK). The charge control surface layer 102 and protrusions 101 may also be formed of different materials. The protrusions and charge control surface layer may assist with encouraging contact of the electrostatic chuck with the substrate to promote contact cooling, while also reducing production of undesirable particles. The gas seal rings (not shown) of the electrostatic chuck may be formed of a polymer, such as the same polymer as the protrusions 101. The adhesive layer 103 may comprise a different polymer from the charge control layer 102. In particular, where the charge control layer 102 is formed of polyether ether ketone (PEEK), the adhesive layer 103 may comprise polyetherimide (PEI).

In another embodiment according to the invention, the charge control surface layer 102 and/or any protrusions 101 in the chuck need not include a polymer, and may be formed of silicon containing nitrides, oxides, carbides and non-stoichiometric versions of these, for example but not limited to $SiO_xN_y$, silicon nitride, silicon oxide or silicon carbide. The ratio of silicon to other substances in the charge control surface layer 102, by atomic percent, may be controlled in order to achieve a desired level of high surface resistivity, including by using an increased ratio of silicon to other substances in order to increase the surface resistivity and/or a decreased ratio of silicon to other substances in order to decrease the surface resistivity. The charge control surface layer 102 may also comprise carbon or a nitride compound of carbon; and may comprise diamond-like carbon; and/or a combination of any of the foregoing. Other substances having surface resistivities in the desired range may be used for the charge control surface layer 102.

Figure 2:
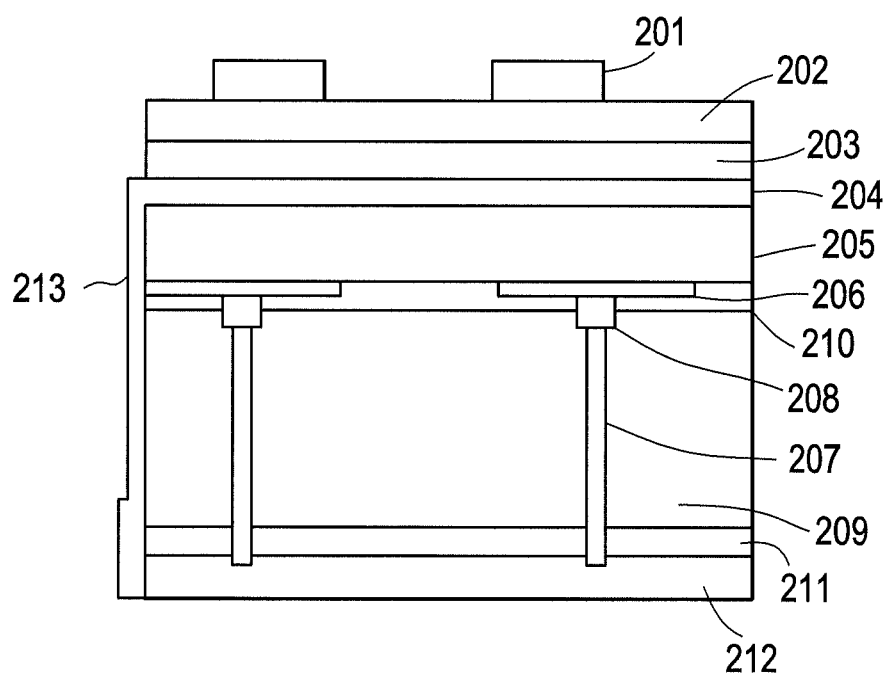
FIG. 2 is a cross-sectional diagram showing further layers of an electrostatic chuck in accordance with an embodiment of the invention.

FIG. 2 is a cross-sectional diagram showing further layers of an electrostatic chuck in accordance with an embodiment of the invention. In addition to protrusions 201, charge control layer 202, adhesive layer 203, adhesion coating 204 and dielectric layer 205, the electrostatic chuck includes metal electrodes 206. The metal electrodes 206 are bonded to electrode pins 207 by electrically conductive epoxy bonds 208. The dielectric layer 205 is bonded to a insulator layer 209, such as an alumina insulator, by a ceramic to ceramic bond 210. The ceramic to ceramic bond 210 may be formed of a polymer, such as polytetrafluoroethylene (PTFE) or modified PTFE (which includes PFA and/or FEP in addition to PTFE). Further, the ceramic to ceramic bond 210 may be formed of polymers such as perfluoroalkoxy (PFA), fluorinated ethylene-propylene (FEP) and polyether ether ketone (PEEK). Underneath the insulator 209 there is a thermally conductive bond 211 (which may be formed, for example, using TRA-CON thermally conductive epoxy, sold by TRA-CON, Inc. of Bedford, Mass., U.S.A.) and a water cooled base 212. The adhesion coating 204 may extend down an edge of the electrostatic chuck (including down the edges of the gas seal rings) to form a metals reduction layer 213, which prevents beam strikes on the edges of the electrostatic chuck from causing aluminum particles to strike the substrate.

In accordance with an embodiment of the invention, the polyetherimide (PEI) used for the protrusions 201, charge control layer 202 or other components of the electrostatic chuck may be formed of unfilled amorphous polyether imide (PEI), in a thickness of between about 12 microns and about 25 microns. For example, PEI sold under the tradename ULTEM 1000 may be used, sold by Sabic Innovative Plastics Holdings BV. Where the protrusions 201 and/or charge control layer 202 or other components are formed of polyether ether ketone (PEEK), they may be made from unfilled PEEK, in a thickness of between about 12 microns and about 25 microns. For example, PEEK sold under the trade name Victrex® APTIV PEEK™ FILM, 2000-006 (unfilled amorphous grade) may be used, sold by Victrex U.S.A., Inc. of West Conshohocken, Pa., U.S.A.

An electrostatic chuck in accordance with an embodiment of the invention may include features of the electrostatic chuck of U.S. patent application Ser. No. 12/454,336, filed on May 15, 2009, published as U.S. Patent Application Publication No. 2009/0284894, the teachings of which are hereby incorporated by reference in their entirety. In particular, features relating to equally spaced protrusions, trigonal pattern protrusions and low particle production may be included, and other features may also be included. Further, an electrostatic chuck in accordance with an embodiment of the invention may include features of the electrostatic chuck of PCT Application PCT/US2010/034667, filed on May 13, 2010, entitled "Electrostatic Chuck With Polymer Protrusions," the teachings of which are hereby incorporated by reference in their entirety. In particular, features relating to polymer protrusions and charge control layers may be included, and other features may also be included.

Figure 3:
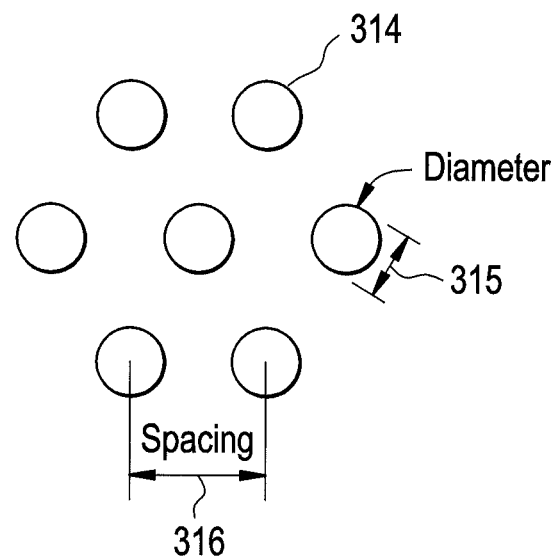
FIG. 3 is an illustration of a pattern of protrusions on the surface of an electrostatic chuck in accordance with an embodiment of the invention.

FIG. 3 is an illustration of a pattern of protrusions 314 on the surface of an electrostatic chuck, in accordance with an embodiment of the invention, in which the protrusion pattern is used to reduce the forces between a substrate and the protrusions 314. Protrusion patterns that equally distribute such forces may be used, for example trigonal or generally hexagonal patterns of protrusions. It should be appreciated that, as used herein, a "trigonal" pattern is intended to mean a regularly repeating pattern of equilateral triangles of protrusions, such that the protrusions are substantially equally spaced apart. (Such a pattern may also be viewed as being generally hexagonal in shape, with a central protrusion in the center of an array of six protrusions that form the vertices of a regular hexagon). Forces may also be reduced by increasing the diameter 315 of the protrusions, or by decreasing the center-to-center spacing 316 of the protrusions 314. As shown in the embodiment of FIG. 3, the protrusions may be disposed in an equally spaced arrangement, in which each protrusion is substantially equally spaced apart from the adjacent protrusions by a center to center spacing dimension 316. By virtue of such spacing, a substantial portion of the back side of the substrate contacts the top portion of the protrusions, leaving a gap between the protrusions for helium or other gas for back side cooling. By contrast, without such protrusion spacing, only a small portion, 10% or less, of the protrusions may contact the substrate. In accordance with an embodiment of the invention the substrate may contact greater than 25% of the protrusion's top surface area.

In one example, the electrostatic chuck may be a 300 mm configuration, including an aluminum base, an alumina insulator 209 of about 0.120 inches in thickness, an alumina dielectric 205 of about 0.004 inches thickness, and having a rotary platen design to allow rotating and tilting of the substrate that is mounted to the electrostatic chuck. The diameter of the electrostatic chuck may, for example, be 300 mm, 200 mm or 450 mm. The protrusions 314 may be in a trigonal pattern, with a center to center spacing dimension 316 of from about 6 mm to about 8 mm, for example. The diameter 315 of the protrusions may, for example, be about 900 microns. The height of the protrusions 314 may, for example, be from about 3 microns to about 12 microns, such as about 6 microns. The protrusions 314 may be formed entirely of polymer, as may be the charge control layer 202 (see FIG. 2).

Figure 4:
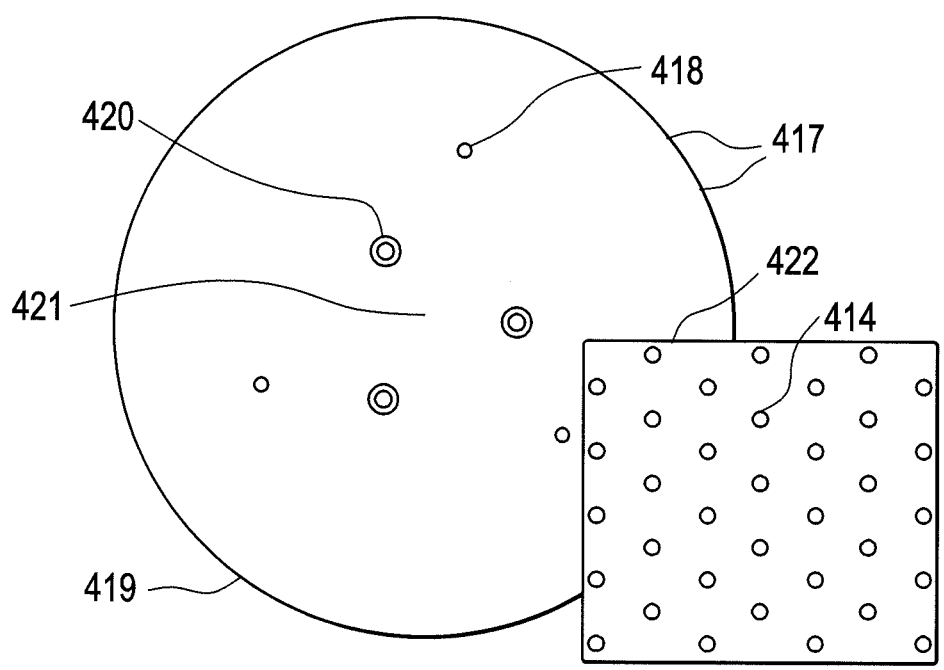
FIG. 4 is a diagram of the surface appearance of an electrostatic chuck in accordance with an embodiment of the invention.

FIG. 4 is a diagram of the surface appearance of an electrostatic chuck in accordance with an embodiment of the invention. The electrostatic chuck surface includes gas inlets 417, a ground pin passage 418, a gas seal ring 419, a lift pin passage 420 that includes its own gas seal ring (outer light-colored structure of lift pin passage 420 in FIG. 4), and a small gas inlet at 421 in the center of the chuck (inlet not visible in FIG. 4). The ground pin passage 418 may include its own gas seal ring (outer ring of ground pin passage 419 in FIG. 4). A detail view (inset 422 in FIG. 4) shows the protrusions 414. The gas seal ring 419 (and the gas seal rings of the lift pin passages 420 and ground pin passages 418) may be about 0.1 inches in width and may have an equal height to that of the protrusions 414, such as from about 3 microns to about 12 microns, for example about 6 microns, although other widths and heights are possible.

In accordance with an embodiment of the invention, an electrostatic chuck may be made by the process of, first, preparing the ceramic assembly using a ceramic to ceramic bond. For example, the dielectric layer 205 may be bonded to the insulator layer 209 using the bonding substances described above in connection with the embodiment of FIG. 2. Next, the ceramic assembly is coated with the adhesion coating 204, such as the substances discussed above in connection with the embodiment of FIG. 1, to a thickness of about 1 or 2 microns. Next, the polymer substance that will make up the charge control layer 202 and protrusions 201 is bonded to the surface of the adhesion coating 204. The top of the polymer substance may then be plasma treated to help photoresist (applied next) to stick. Next, photoresist is deposited on the polymer substance, and is exposed and developed. Next, a reactive ion etch process is used to remove a thickness of the polymer substance (such as between about 3 microns and about 12 microns, in particular about 6 microns) to create the areas etched between the protrusions 201. The amount etched away (resulting in the height of the protrusions) may be optimized for the back side gas pressure that will be used with the electrostatic chuck. The height of the protrusions is preferably approximately the same as, or substantially equal to, the mean free path of the gas used in back side cooling. After etching, the photoresist is then stripped off. Next, a high surface resistivity charge control surface layer may be produced by altering the surface resistivity of the surface layer that has been produced. For example, the surface layer may be altered to have a higher surface resistivity by treating the surface layer that has been produced with reactive ion etching, including plasma treatment, chemical treatment and/or rehydrogenation treatment. The plasma treatment may be an oxygen plasma treatment. Next, the process may proceed to final assembly of the electrostatic chuck.

In accordance with an embodiment of the invention, a high surface resistivity charge control surface layer may be produced by altering the surface resistivity of a surface layer that initially has a lower surface resistivity. The altering of the surface resistivity may produce a surface resistivity after treatment that is within plus or minus 25% of what the surface resistivity would have been prior to treatment. The altering of the surface resistivity may be performed after the lower surface resistivity surface layer has been patterned. For example, the initial lower surface resistivity surface layer may include a polymer, such as polyetherimide (PEI), polyimide or polyether ether ketone (PEEK). Alternatively, the initial lower surface resistivity surface layer may include silicon containing nitrides, oxides, carbides and non-stoichiometric versions of these, for example but not limited to $SiO_xN_y$, silicon nitride, silicon oxide or silicon carbide. The initial lower surface resistivity surface layer may also comprise carbon or a nitride compound of carbon; and may comprise diamond-like carbon; and/or a combination of any of the foregoing.

In accordance with an embodiment of the invention, an initially formed surface layer may be treated by any of the processes described above, such as reactive ion etching, to achieve a surface resistivity of greater than about $10^{11}$ ohms per square, including greater than about $10^{12}$ ohms per square, greater than about $10^{13}$ ohms per square, and/or a range from about $1\times10^{11}$ ohms/square to about $1\times10^{16}$ ohms/square, and/or a range of from about $1\times10^{12}$ ohms/square to about $1\times10^{16}$ ohms/square, and/or a range of from about $1\times10^{13}$ ohms/square to about $1\times10^{16}$ ohms/square. In accordance with an embodiment of the invention, the surface resistivity may be measured according to the standards set forth in ASTM Standard D257-07, entitled "Standard Test Methods for DC Resistance or Conductance of Insulating Materials," published by ASTM International of West Conshohocken, Pa., U.S.A., the entire disclosure of which is hereby incorporated herein by reference. The surface resistivity may be measured on the surface of the electrostatic chuck to which a substrate is clamped, using a standard surface resistivity probe, for example a TREK circular probe, sold by TREK, Inc. of Medina, N.Y., U.S.A. Where the surface of the electrostatic chuck includes protrusions, the surface resistivity may be measured either on the area of the surface that is between the protrusions or on the surface of the protrusions. For surface resistivities greater than about $10^{14}$ ohms per square, physisorbed water can affect the measurement of surface resistivity, and measurement in a dry environment or vacuum is therefore preferably used.

In accordance with an embodiment of the invention, a higher surface resistivity layer may also be applied to an electrostatic chuck directly, without modifying an initially lower surface resistivity layer. Also, a higher surface resistivity layer may be applied after first removing at least part of an initially lower surface resistivity layer using an etching process, such as a reactive ion etch process. For example, where an initial lower surface resistivity surface layer includes silicon containing nitrides, oxides, carbides and non-stoichiometric versions of these, a portion of the surface layer may be removed by a reactive ion etch process until an insulator layer of the electrostatic chuck is exposed, and then a higher surface resistivity coating may be applied.

Figure 5:
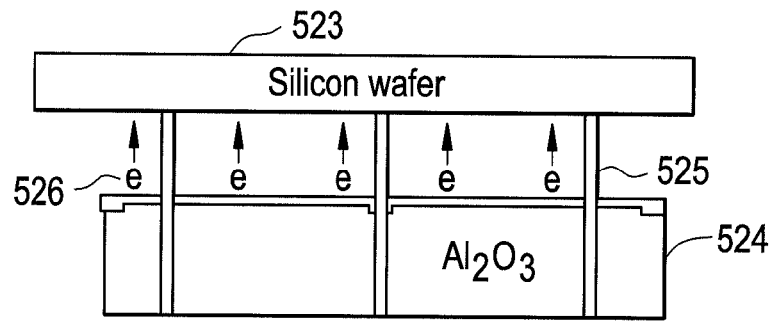
FIG. 5 is a diagram illustrating lift pins raising a substrate having a thick oxide or nitride insulating layer off the surface of a prior art electrostatic chuck.

Without wishing to be bound by theory, there is next discussed a possible mechanism underlying a triboelectric surface charging effect that results in wafer sticking, and that may be mitigated by a high surface resistivity layer in accordance with an embodiment of the invention. Electrostatic clamping generates an intimate contact interface between the electrostatic chuck surface and the substrate, and generates strong molecular attractive forces, such as Van der Waal's forces. FIG. 5 is a diagram illustrating the raising of a substrate 523 having a thick oxide or nitride insulating layer off the surface of a prior art electrostatic chuck 524. As the lift pins 525 are driven up, the intimate contact interface between the substrate 523 and the electrostatic chuck 524 is torn apart and a triboelectric surface charge is generated. The substrate 523 is electronegative (attracts electrons), and the surface of the electrostatic chuck 524 gives up electrons 526 to the oxide surface of the substrate. Triboelectric charging, as is believed to occur here, is the process of electron transfer as a result of two objects coming into contact with each other and then separating. The prefix "tribo" means "to rub." The process of triboelectric charging results in one object gaining electrons on its surface, and therefore becoming negatively charged, and another object losing electrons from its surface, and therefore becoming positively charged.

Figure 6:
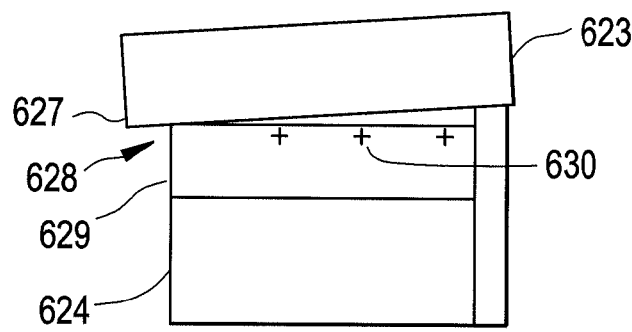
FIG. 6 is a diagram of a substrate having a thick oxide or nitride insulating layer, as the substrate is rising off the surface of an electrostatic chuck in accordance with an embodiment of the invention.

FIG. 6 is a diagram of a substrate 623 having a thick oxide or nitride insulating layer 627, as the substrate 623 is rising off the surface of an electrostatic chuck 624 in accordance with an embodiment of the invention. Generally, a substrate 623 will never lift off exactly parallel from the surface of the electrostatic chuck 624, and there will therefore be a last point of contact 628 between the substrate 623 and the electrostatic chuck 624. In a prior art electrostatic chuck, the last point of contact 628 could be the point of wafer sticking. However, in an electrostatic chuck 624 in accordance with an embodiment of the invention, a high resistivity surface 629 has positive charges 630 left on its surface that are not mobile. Negative charges in the oxide or nitride insulating layer 627 of the substrate are likewise not mobile. The surface of the chuck 624 and the surface of the substrate 623 are charged with opposite polarity, but the charges are randomly placed and spread out, and thus too weak to cause significant wafer sticking. Accordingly, a high resistivity surface 629 in accordance with an embodiment of the invention helps to prevent wafer sticking.

Figure 7:
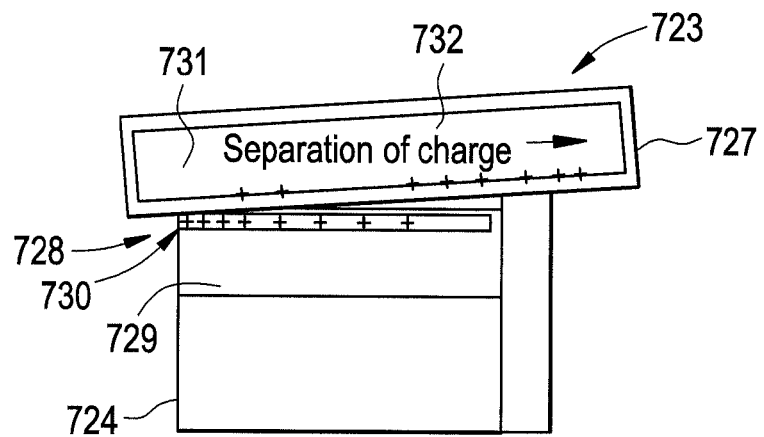
FIG. 7 is a diagram of a substrate having a thick oxide or nitride insulating layer, as the substrate is rising off the surface of a prior art electrostatic chuck.

By contrast, FIG. 7 is a diagram of a substrate 723 having a thick oxide or nitride insulating layer 727, as the substrate 723 is rising off the surface of a prior art electrostatic chuck 724. In this case, the electrostatic chuck 724 has a lower surface resistivity surface 729. Both the negative charges 731 in the substrate 723 and the positive charges 730 in the lower resistivity surface 729 are mobile; a separation of charge 732 occurs in the substrate 723 and the charges 731 and 730 migrate towards the last point of contact 728 to form a strong capacitor, thereby sticking the corner of the substrate 723 to the electrostatic chuck 724.

In one possible failure mode, the surface resistivity of an electrostatic chuck could be effectively lowered in use when arsenic and/or phosphorus are ejected from a heated graphite target upon which a conductive beam is being directed. The ejected arsenic and/or phosphorus can be deposited and condensed on the surface of the cooled electrostatic chuck, thereby lowering its surface resistivity and potentially resulting in subsequent wafer sticking. Thus, a surface resistivity in accordance with an embodiment of the invention should be high enough not to be reduced to an undesirably low level of surface resistivity by the effect of such beam deposits.

In accordance with an embodiment of the invention, experiments were performed with oxide/nitride coated wafers using electrostatic chucks having low resistivity surfaces and high resistivity surfaces, as shown in Table 1 below. Surface resistivities were measured using a TREK circular probe, sold by TREK, Inc. of Medina, N.Y., U.S.A. The oxide wafers stuck to all of the low surface resistivity electrostatic chucks, and normal wafer cycling was not possible. However, the oxide wafers did not stick to any of the high surface resistivity electrostatic chucks. An embodiment according to the invention therefore exhibited success in mitigating wafer sticking.

TABLE 1

Comparison of Wafer Sticking for Differing Surface Resistivities

| Measured Platen Surface Resistivity in Ohms/Square | Wafer Type | Expected Result | Observed Result |
|---|---|---|---|
| $10^{14}$ | Oxide/Nitride 800A/200A | No Wafer Sticking | No Wafer Sticking |
| $10^{10}$ | Oxide/Nitride 800A/200A | Wafer Sticking | Wafer Sticking |

In accordance with an embodiment of the invention, an electrostatic chuck may include protrusions having a height of about 6 microns, and having a very smooth wafer contact surface. For example, the protrusion may have a surface roughness on the wafer contact surface of about 0.02 μm to about 0.05 μm. Likewise, the gas seal rings may have a similarly smooth surface, which results in a good seal with the substrate. In accordance with an embodiment of the invention, the gas seal rings of the electrostatic chuck may comprise a surface roughness of less than about 8 microinches, or less than about 4 microinches, or less than about 2 microinches, or less than about 1 microinches.

In accordance with an embodiment of the invention, the electrostatic chuck is a Coulombic chuck. The dielectric can include aluminum, for example alumina or aluminum nitride. In a further embodiment according to the invention, the electrostatic chuck is a Johnsen-Rahbek electrostatic chuck. Alternatively, the electrostatic chuck may not be a Johnsen-Rahbek electrostatic chuck, and the dielectric may be chosen so that a Johnsen-Rahbek (JR) force or partial hybrid Johnsen-Rahbek force does not act on the wafer or substrate.

The teachings of all patents, published applications and references cited herein are incorporated by reference in their entirety.

While this invention has been particularly shown and described with references to example embodiments thereof, it will be understood by those skilled in the art that various changes in form and details may be made therein without departing from the scope of the invention encompassed by the appended claims.

What is claimed is:

1. An electrostatic chuck comprising:
   an electrode; and
   a surface layer activated by a voltage in the electrode to form an electric charge to electrostatically clamp a substrate to the electrostatic chuck, the surface layer including:
   (i) a dielectric;
   (ii) a charge control layer comprising a polymer, and comprising a surface resistivity of from about $1\times10^{12}$ ohms/square to about $1\times10^{16}$ ohms/square, wherein the polymer included in the charge control layer comprises at least one of polyetherimide (PEI) and polyether ether ketone (PEEK); and
   (iii) a plurality of polymer protrusions extending to a height above portions of the charge control layer surrounding the plurality of polymer protrusions to support the substrate upon the plurality of polymer protrusions during electrostatic clamping of the substrate.

2. An electrostatic chuck according to claim 1, wherein the charge control layer comprises a surface resistivity of from about $1\times10^{13}$ ohms/square to about $1\times10^{16}$ ohms/square.

3. An electrostatic chuck according to claim 1, wherein the polymer of which the plurality of polymer protrusions are formed comprises at least one of polyetherimide (PEI), polyimide and polyether ether ketone (PEEK).

4. An electrostatic chuck according to claim 1, wherein the polymer of which the plurality of polymer protrusions are formed comprises polyetherimide (PEI), wherein the charge control layer is formed of polyetherimide (PEI), and wherein the charge control layer comprises a surface resistivity of from about $1\times10^{13}$ ohms/square to about $1\times10^{16}$ ohms/square.

5. A method of manufacturing an electrostatic chuck, the method comprising:
   forming a surface layer in the electrostatic chuck, the surface layer comprising:
   (i) a dielectric;
   (ii) a charge control layer comprising a polymer, and comprising a surface resistivity of from about $1\times10^{12}$ ohms/square to about $1\times10^{16}$ ohms/square, wherein the polymer included in the charge control layer comprises at least one of polyetherimide (PEI) and polyether ether ketone (PEEK); and
   (iii) a plurality of polymer protrusions extending to a height above portions of the charge control layer surrounding the plurality of polymer protrusions to support the substrate upon the plurality of polymer protrusions during electrostatic clamping of the substrate.

6. A method according to claim 5, wherein the charge control layer comprises a surface resistivity of from about $1\times10^{13}$ ohms/square to about $1\times10^{16}$ ohms/square.

7. A method according to claim 5, wherein the method comprising reducing frequency of wafer sticking in use of the electrostatic chuck without modifying the functioning of the electrostatic chuck, including by not modifying at least one of the power supply, electrode structure, dielectric thickness, mechanical properties and clamping force of the electrostatic chuck.

8. A method according to claim 5, wherein the forming the charge control layer comprises altering the surface resistivity of a surface layer that has already been produced.

9. A method according to claim 8, wherein the altering the surface resistivity comprises treating the surface layer, which has already been produced, using a reactive ion etch process.

10. A method according to claim 9, wherein the altering the surface resistivity comprises performing at least one of a plasma treatment, a chemical treatment and a rehydrogenation treatment of the surface layer that has already been produced.

11. A method according to claim 9, wherein the altering of the surface resistivity produces a surface resistivity after treatment that is within plus or minus 25% of what the surface resistivity would have been prior to treatment.

12. A method according to claim 9, wherein the method comprises, prior to forming the charge control layer:
bonding a dielectric layer of the electrostatic chuck to an insulator layer of the electrostatic chuck;
coating the dielectric layer of the electrostatic chuck with an adhesion coating layer comprising at least one of silicon containing nitride, silicon containing oxide, silicon containing carbide, non-stoichiometric silicon containing nitride, non-stoichiometric silicon containing oxide, non-stoichiometric silicon containing carbide, carbon and a nitride compound of carbon;
bonding the charge control layer comprising the charge control layer polymer to the surface of the electrostatic chuck, the charge control layer polymer comprising at least one of polyetherimide (PEI), polyimide and polyether ether ketone (PEEK);
depositing a photoresist onto the charge control layer;
reactive ion etching the charge control layer to remove portions of the charge control layer that will surround the plurality of polymer protrusions being formed in the charge control layer; and
stripping the photoresist off the electrostatic chuck, thereby revealing the plurality of polymer protrusions being formed of the same charge control layer polymer as the charge control layer.

13. A method of manufacturing an electrostatic chuck, the method comprising:
forming a charge control layer in the electrostatic chuck, the charge control layer comprising at least one of silicon containing oxide, silicon containing carbide, non-stoichiometric silicon containing oxide, non-stoichiometric silicon containing carbide, carbon and a nitride compound of carbon, and comprising a surface resistivity of from about $1\times10^{12}$ ohms/square to about $1\times10^{16}$ ohms/square;
wherein the method comprises reducing frequency of wafer sticking in use of the electrostatic chuck without modifying the functioning of the electrostatic chuck, including by not modifying at least one of the power supply, electrode structure, dielectric thickness, mechanical properties and clamping force of the electrostatic chuck.

14. A method of manufacturing an electrostatic chuck, the method comprising:
forming a charge control layer in the electrostatic chuck, the charge control layer comprising at least one of silicon containing oxide, silicon containing carbide, non-stoichiometric silicon containing oxide, non-stoichiometric silicon containing carbide, carbon and a nitride compound of carbon, and comprising a surface resistivity of from about $1\times10^{12}$ ohms/square to about $1\times10^{16}$ ohms/square;
wherein the forming the charge control layer comprises altering the surface resistivity of a surface layer that has already been produced;
wherein the altering the surface resistivity comprises treating the surface layer, which has already been produced, using a reactive ion etch process; and
wherein the altering of the surface resistivity produces a surface resistivity after treatment that is within plus or minus 25% of what the surface resistivity would have been prior to treatment.

* * * * *

UNITED STATES PATENT AND TRADEMARK OFFICE
CERTIFICATE OF CORRECTION

| | | |
|---|---|---|
| PATENT NO. | : 9,025,305 B2 | Page 1 of 1 |
| APPLICATION NO. | : 13/699279 | |
| DATED | : May 5, 2015 | |
| INVENTOR(S) | : Richard A. Cooke et al. | |

It is certified that error appears in the above-identified patent and that said Letters Patent is hereby corrected as shown below:

Title Page, Item (73), Assignees:, delete "Eillerica, MA" and insert --Billerica, MA--

Signed and Sealed this
Fifteenth Day of September, 2015

Michelle K. Lee
*Director of the United States Patent and Trademark Office*